United States Patent
Miura et al.

(10) Patent No.: US 6,972,459 B2
(45) Date of Patent: Dec. 6, 2005

(54) METAL OXIDE SEMICONDUCTOR TRANSISTOR HAVING A NITROGEN CLUSTER CONTAINING LAYER EMBEDDED IN THE SUBSTRATE

(75) Inventors: Shoji Miura, Aichi-ken (JP); Mikimasa Suzuki, Toyohashi (JP); Akira Kuroyanagi, Okazaki (JP); Yoshitaka Nakano, Aichi-ken (JP)

(73) Assignee: Denso Corporation, Kariya (JP)

( * ) Notice: Subject to any disclaimer, the term of this patent is extended or adjusted under 35 U.S.C. 154(b) by 92 days.

(21) Appl. No.: 10/164,313

(22) Filed: Jun. 7, 2002

(65) Prior Publication Data

US 2002/0195651 A1  Dec. 26, 2002

(30) Foreign Application Priority Data

Jun. 7, 2001 (JP) .................................. 2001-172760

(51) Int. Cl.[7] ............................................. H01L 29/94
(52) U.S. Cl. ...................................................... 257/335
(58) Field of Search ................................ 257/172, 173, 257/328, 329, 350, 351, 359, 341, 288, 327, 335, 336, 337, 338, 340, 342, 343

(56) References Cited

U.S. PATENT DOCUMENTS

H569 H  *  1/1989  Varker et al.

| | | | |
|---|---|---|---|
| 5,243,205 A | * | 9/1993 | Kitagawa et al. |
| 5,268,586 A | * | 12/1993 | Mukherjee et al. |
| 5,395,776 A | * | 3/1995 | Shibib |
| 6,153,896 A | | 11/2000 | Omura et al. |
| 6,486,513 B1 | * | 11/2002 | Matsumoto et al. |

FOREIGN PATENT DOCUMENTS

| | | | |
|---|---|---|---|
| JP | 2-260428 | | 10/1990 |
| JP | 3-259537 | | 11/1991 |
| JP | 03259537 A | * | 11/1991 |
| JP | 3-263376 | | 11/1991 |
| JP | 3-283376 | | 11/1991 |
| JP | 6-125075 | | 5/1994 |
| JP | 10-189609 | | 7/1998 |
| JP | 10-321856 | | 12/1998 |
| JP | 2000-269234 | | 9/2000 |
| JP | 2001-358146 | | 12/2001 |
| JP | 2001358146 A | * | 12/2001 |

* cited by examiner

*Primary Examiner*—Nathan J. Flynn
*Assistant Examiner*—Kevin Quinto
(74) *Attorney, Agent, or Firm*—Posz & Bethards, PLC (57) ABSTRACT

A drift layer is formed on a substrate. A base region is formed on the drift layer. A plurality of source regions are formed in a surficial layer of the base region. A plurality of gate electrodes face to the base region and the source region via a gate insulating film. A source electrode is brought into contact with the base region and the source region. A nitrogen cluster containing layer is embedded in the drift layer so as to extend laterally under the base region so that at least part of the drift region is left under the nitrogen cluster containing layer.

9 Claims, 12 Drawing Sheets

METAL OXIDE SEMICONDUCTOR TRANSISTOR HAVING A NITROGEN CLUSTER CONTAINING LAYER EMBEDDED IN THE SUBSTRATE

BACKGROUND OF THE INVENTION

The present invention relates to a metal oxide semiconductor (referred to as MOS) transistor and its manufacturing method.

Figure 11:
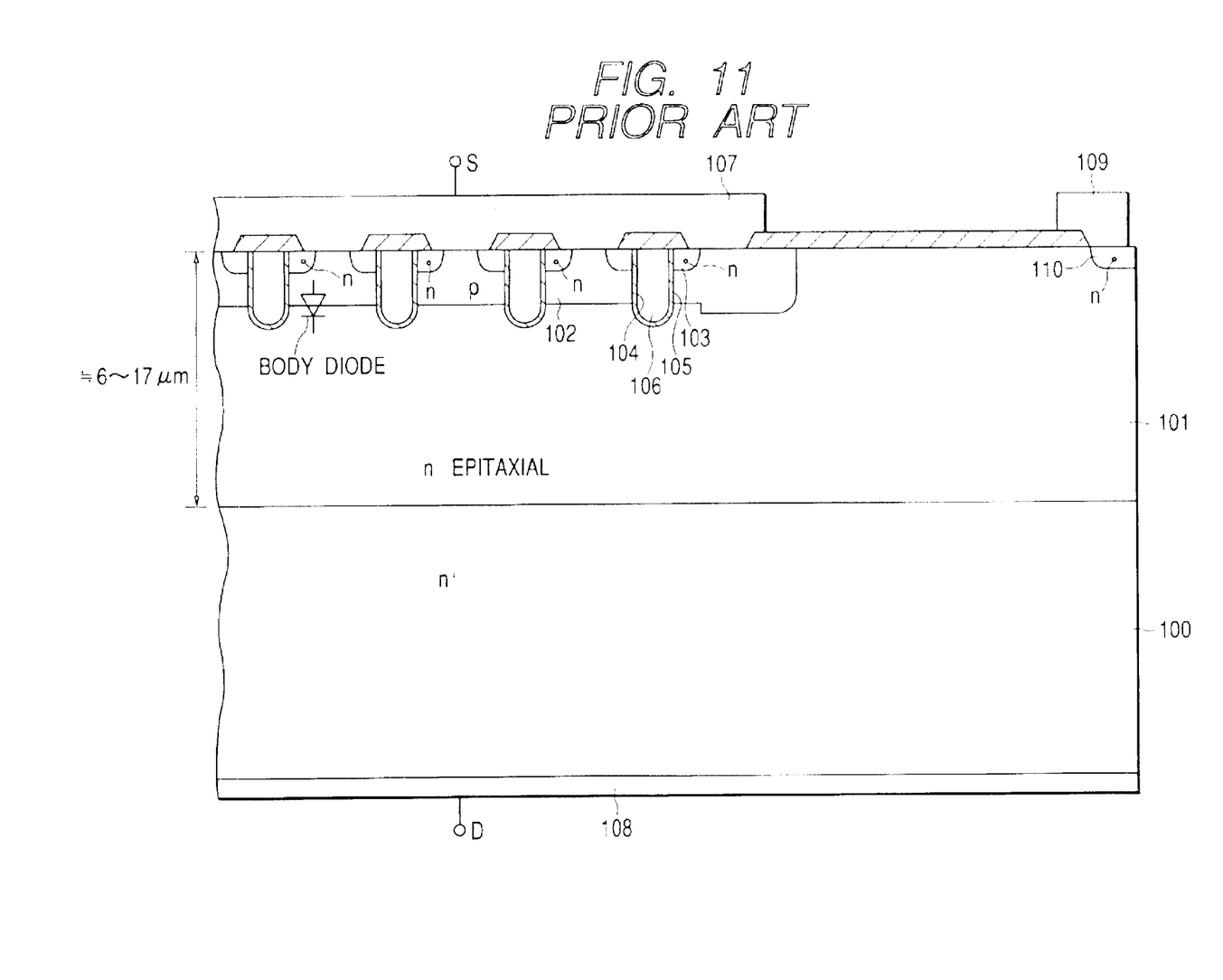
FIG. 11 is a vertical cross-sectional view explaining a conventional MOSFET.

FIG. 11 shows an arrangement of a conventional MOSFET, in which a double-diffused metal oxide semiconductor (referred to as DMOS) element has a rated withstand voltage of 60~200V and is formed on a wafer. The wafer has n-epitaxial layer (i.e., drift layer) 101 having a film thickness of approximately 6~17 $\mu$m formed on $n^+$ substrate 100. More specifically, p base region 102 is formed on a surficial layer of n-epitaxial layer (i.e., drift layer) 101 and a plurality of n source layers 103 are formed on a surficial layer of p base region 102. And, a plurality of trenches 104 are formed in the n-epitaxial layer 101. A gate electrode 106 is disposed in each trench 104 via gate insulating film 105 so as to face the p base region 102 and the n source layer 103. A source electrode 107, provided on the n-epitaxial layer 101, is brought into contact with the p base region 102 and with the n source layer 103. A drain electrode 108 is formed on a reverse surface of the $n^+$ substrate 100.

Forming the n-epitaxial layer 101 (i.e., drift layer) 101 having the film thickness of approximately 6~17 $\mu$m on $n^+$ substrate 100 is done from the reason that an element withstand voltage (BVdss) is determined according to the film thickness of the n-epitaxial layer 101. An equipotential ring (EQR) 109 is disposed along the outer peripheral end of the chip. Furthermore, n region 110, formed in the n-epitaxial layer 101, is positioned beneath the equipotential ring (EQR) 109.

The DMOS element can be used as an inverter. In this case, an internal body diode of the DMOS element serves as a commutating diode. This is advantageous in that the cost can be reduced compared with another inverter formed by an IGBT element which requires a specific commutating diode (i.e., an external diode).

However, the reverse recovery characteristics of the internal body diode of this element is are generally dissatisfactory. The recovery surge voltage is high and an oscillation phenomenon (i.e., a so-called ringing) occurs. This leads to element breakage and noise generation which cannot be accepted in view of the performance level required for transistor products.

To suppress the surge voltage and prevent the oscillation, it is possible to add a gate resistor or any other adjusting means to reduce the switching speed. A snubber circuit can be also added to suppress the surge voltage and prevent the oscillation. However, the performance will deteriorate. The cost will increase. And, the size will increase.

Figure 12:
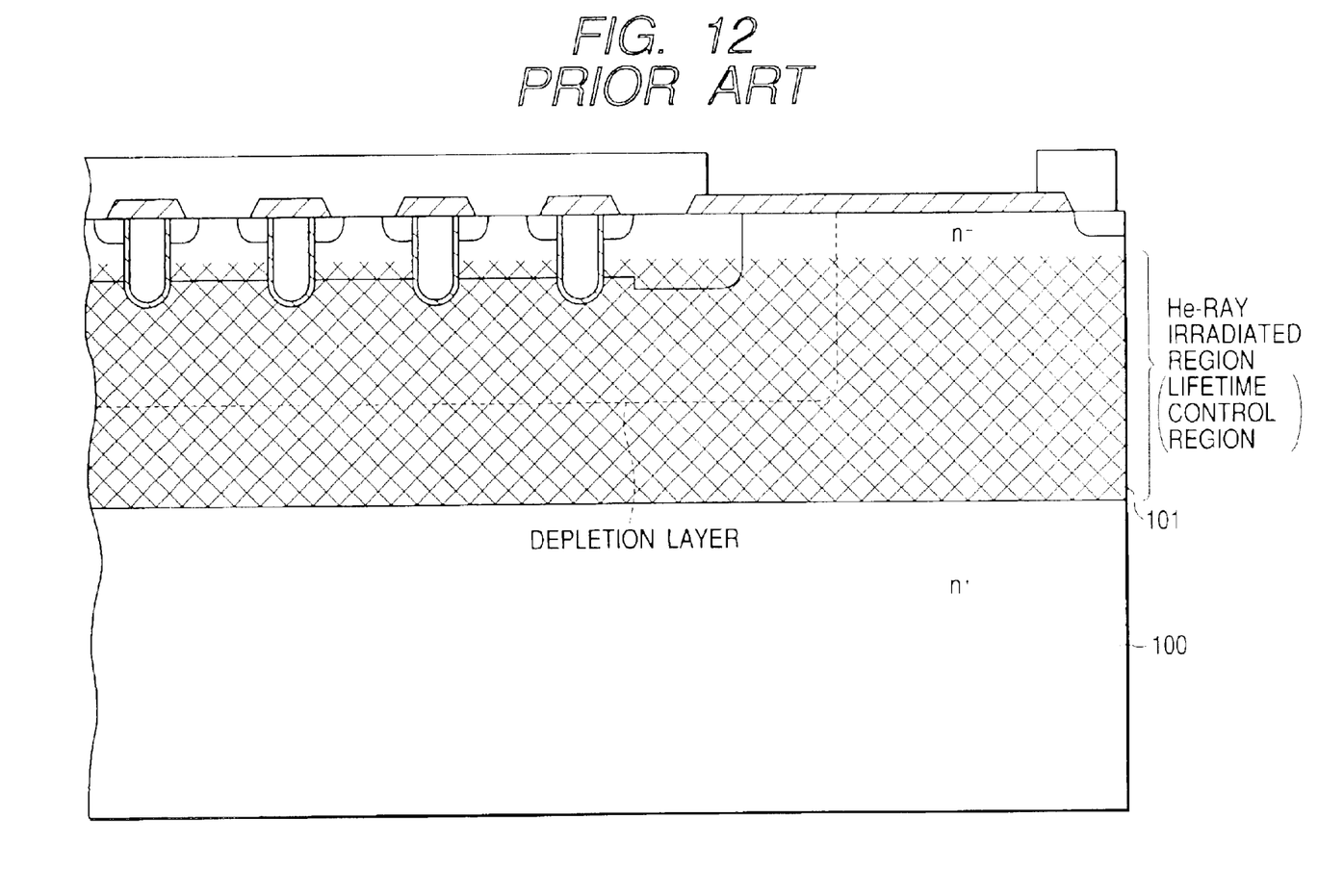
FIG. 12 is a vertical cross-sectional view showing the conventional MOSFET.

On the other hand, to improve the recovery characteristics of the body diode, He ray irradiation (refer to FIG. 12), electron ray irradiation, or heavy metal diffusion can be preferably used to shorten the lifetime of n-epitaxial layer 101. In any case, as shown in FIG. 12, the lifetime of the entire region of n-epitaxial layer 101 is shortened. This will realize rapid recovery. However, it is difficult to suppress the surge voltage and prevent the oscillation.

SUMMARY OF THE INVENTION

In view of the problems of the conventional MOS transistor, the present invention has an object to provide a MOS transistor which is capable of not only shortening the recovery time of an internal body diode but also suppressing the surge voltage and oscillation during the recovery.

Furthermore, the present invention has an object to provide a method for manufacturing the MOS transistor of the present invention.

The problem explained with reference to FIGS. 11 and 12 is caused due to the lack of carriers remaining in the n-region located under a depletion layer at the time a reverse recovery current is maximized (i.e., at the time a power source voltage restores in the diode) during the reverse recovery of a diode. According to the conventionally known methods (i.e., He ray irradiation, electronic ray irradiation, and heavy metal diffusion), the lifetime of the entire region of the n-layer is shortened. This is the reason why no carriers remain at the time the recovery current is maximized.

In order to accomplish the above and other related objects, the present invention provides a metal oxide semiconductor transistor comprising a drift layer of a first conductive type formed on a substrate, a base region of a second conductive type formed on the drift layer, at least one source region of the first conductive type formed in a surficial layer of the base region, at least one gate electrode facing to the base region and the source region via a gate insulating film, and a source electrode brought into contact with the base region and the source region. The metal oxide semiconductor transistor is characterized in that a nitrogen cluster containing layer is embedded in the drift layer. The nitrogen cluster containing layer extends under the base region. And, at least part of the drift region is left under the nitrogen cluster containing layer.

According to this arrangement, the nitrogen cluster containing layer is locally embedded in the semiconductor substrate. This makes it possible to shorten the lifetime of a region where the nitrogen cluster containing layer is formed, while the remaining region provided with no nitrogen containing layer has an ordinary lifetime.

Accordingly, when the body diode is in a reverse recovery process during operation of an inverter, carriers residing in the drift layer quickly extinguish in the vicinity of the base region. Hence, it becomes possible to shorten the recovery time. Furthermore, a sufficient amount of carriers are stored in the region where the nitrogen cluster containing layer is not formed. This makes it possible to suppress the surge voltage and oscillation during recovery of a diode.

According to a preferred embodiment of the present invention, it is preferable that the center of the nitrogen cluster containing layer is positioned at the depth of 1 $\mu$m to 3 $\mu$m from a bottom surface of the base region.

It is also preferable that the nitrogen cluster containing layer is selectively disposed along a plane parallel to a surface of the semiconductor substrate. The region where the nitrogen cluster containing layer is not provided corresponds to a region where a significant carriers are stored. This substantially provides a drift layer outside the nitrogen cluster containing layer in addition to a drift layer located under the nitrogen cluster containing layer. The added drift layer acts to suppress the surge voltage and oscillation during the recovery of a diode.

In this case, it is preferable that the nitrogen cluster containing layer is not provided in a peripheral region of the semiconductor substrate.

Furthermore, it is preferable that a depletion layer extends laterally beyond the edge of the base region, and the nitrogen cluster containing layer extends fully within the region of the depletion layer in parallel with the surface of the semiconductor substrate.

Furthermore, the present invention provides a method for manufacturing the above-described metal oxide semiconductor transistor. The manufacturing method of the present invention comprises a step of forming a semiconductor layer serving as the drift layer on a surface of the substrate by using epitaxial growth, and a step of implanting nitrogen ions into the semiconductor layer to form a nitrogen cluster containing layer which is embedded in the semiconductor layer and extends under the base region so that at least part of the semiconductor layer is left under the nitrogen cluster containing layer.

According to the preferred embodiment of the present invention, it is preferable that the manufacturing method of the present invention further comprises a step of removing an outermost surficial layer of the semiconductor layer by a predetermined thickness to obtain a fresh surface of the semiconductor layer which is free from crystal defect, and a step of forming another semiconductor layer on the fresh surface of the semiconductor layer to obtain a double-layered construction of the drift layer.

It is also preferable that the step of implanting nitrogen ions into the semiconductor layer is performed in such a manner that the center of the nitrogen cluster containing layer is located at the depth of 1 μm to 3 μm from a bottom surface of the base region.

It is also preferable that the step of implanting nitrogen ions into the semiconductor layer is performed in such a manner the nitrogen cluster containing layer is selectively disposed along a plane parallel to a surface of the semiconductor substrate. In this case, a photo resist is placed on a surface of the semiconductor layer before the nitrogen ions are implanted into the semiconductor layer so as to leave a peripheral region of the semiconductor layer where the nitrogen cluster containing layer is not provided.

Moreover, it is preferable that a depletion layer extends laterally beyond the edge of the base region, and the step of implanting nitrogen ions into the semiconductor layer is performed in such a manner the nitrogen cluster containing layer extends fully within the region of the depletion layer in parallel with the surface of the semiconductor substrate.

BRIEF DESCRIPTION OF THE DRAWINGS

The above and other objects, features and advantages of the present invention will become more apparent from the following detailed description which is to be read in conjunction with the accompanying drawings, in which.

DESCRIPTION OF A PREFERRED EMBODIMENT

A preferred embodiment of the present invention will be explained hereinafter with reference to attached drawings. Identical parts are denoted by the same reference numerals throughout the drawings.

Figure 1:
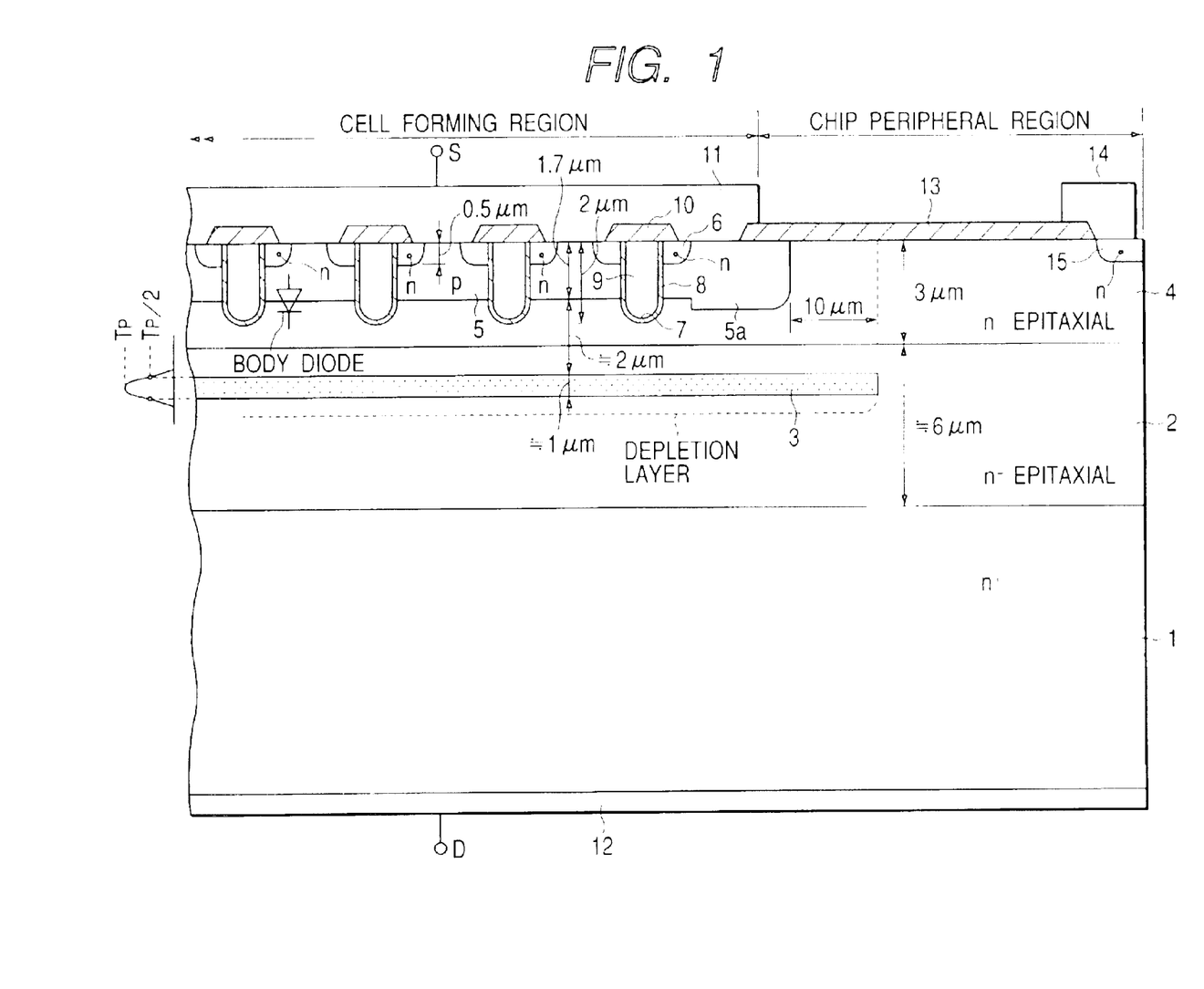
FIG. 1 is a vertical cross-sectional view showing an n channel vertical MOSFET in accordance with a preferred embodiment of the present invention.

FIG. 1 is a vertical cross-sectional view showing an n channel vertical MOSFET (metal oxide semiconductor field effect transistor) in accordance with a preferred embodiment of the present invention. The DMOS element of this embodiment has a rated withstand voltage of 60~200V and is used as a switching element of an inverter.

An n-epitaxial layer 2 having a thickness of approximately 6 μm is formed on an $n^+$ semiconductor substrate 1. An n-epitaxial layer 4 having a thickness of approximately 3 μm is formed on the n-epitaxial layer 2. In a cell forming region, p well region (i.e., p base region) 5 is formed in the surficial layer of the n-epitaxial layer 4. The n-epitaxial layers 2 and 4, located beneath the p well region 5, cooperatively serve as n-drift layer (i.e., drift layer of a first conductive type). The p well region (i.e., p base region) 5 serves as base region of a second conductive type. A plurality of n source regions 6 are formed in the surficial layer of p well region 5.

In this manner, the p base region 5 is positioned on the n-drift layer (2, 4) of the semiconductor substrate. The n source regions 6 are located in the surficial layer of the p base region 5. The p base region 5 has a depth of 1.7 μm. Each n source region 6 has a depth of 0.5 μm.

A plurality of trenches 7, each having a depth of 2 μm, are provided in the cell forming region. Each trench 7 extends from the upper surface of each n source region 6 downward across the n source region 6 and the p base region 5 to reach the n-epitaxial layer 4. A polysilicon gate electrode 9 is formed in the trench 7 via a gate oxide film (i.e., gate insulating film) 8. The gate oxide film 8 has a thickness of 60 nm. The gate electrode 9, disposed in the trench 7 in this manner, faces the p base region 5 and the n source region 6 via the gate insulating film 8. An insulating film 10 covers the gate electrode 9. A source electrode 11, located above the gate electrode 9, is brought into contact with the p base region 5 and the n source region 6. A drain electrode 12 is formed on the reverse surface of $n^+$ semiconductor substrate 1.

An insulating film 13, formed on the upper surface of n-epitaxial layer 4, defines an outer peripheral end of the chip (referred to chip peripheral region). The insulating film 13 is a field region. An equipotential ring (EQR) 14 is disposed along the outer peripheral end of the chip. The equipotential ring 14 is electrically connected to the n-epitaxial layer 4 (i.e., part of the substrate) via an n region 15. The p base region 5 extends laterally into the chip peripheral region beyond the boundary of the cell forming region so as to leave a relatively deep p base region 5a.

A nitrogen cluster containing layer 3 (hereinafter referred to as N cluster containing layer 3) is located in the n-epitaxial layer 2. The N cluster containing layer 3 is located under the p base region 5 and embedded inside the drift layer (2, 4) of the semiconductor substrate. At least par of the drift layer (2) is located under the N cluster containing layer 3.

The N cluster containing layer 3 has a half-value width of the concentration (corresponding to Tp/2 shown in FIG. 1) which is approximately 1 μm in the depth direction. The N cluster containing layer 3 is locally disposed in the n-epitaxial layer 2. The N cluster containing layer 3 is spaced from the p base region 5 in the up-and-down direction. A gap of approximately 2 μm is provided between the upper surface of N cluster containing layer 3 and the bottom surface of p base region 5. In other words, in the depth direction, there is a gap of approximately 3.7 μm between the upper end of N cluster containing layer 3 and upper surface of the semiconductor substrate.

The center of N cluster containing layer 3 is positioned at the depth of 2.5 μm from the bottom surface of p base region 5. Regarding the depth of N cluster containing layer 3, it is preferable that the center of N cluster containing layer 3 is positioned in the region of 1~3 μm from the bottom surface of p base region 5.

Furthermore, the N cluster containing layer 3 is selectively positioned along a plane parallel to the surface of the semiconductor substrate. The N cluster containing layer 3 extends laterally outward from the cell forming region into the chip peripheral region beyond the edge of p base region 5. The protrusion of N cluster containing layer 3 relative to the edge of p base region 5 is 10 μm. In other words, almost all of the chip peripheral region (=insulating film 13+EQR 14) is not provided with the N cluster containing layer 3.

As described above, the N cluster containing layer 3 is embedded in the semiconductor substrate locally in both of the depth direction and the lateral direction. The N cluster containing layer 3 is positioned at the depth of approximately 3.7 μm to 4.7 μm in terms of half-value width from the upper surface of the substrate. Furthermore, the hole lifetime of the cell forming region is short (approximately 0.1 μsec). The remaining region provided with no N cluster containing layer 3 has the lifetime (approximately 200 μsec) of an ordinary epitaxial layer.

Figure 2:
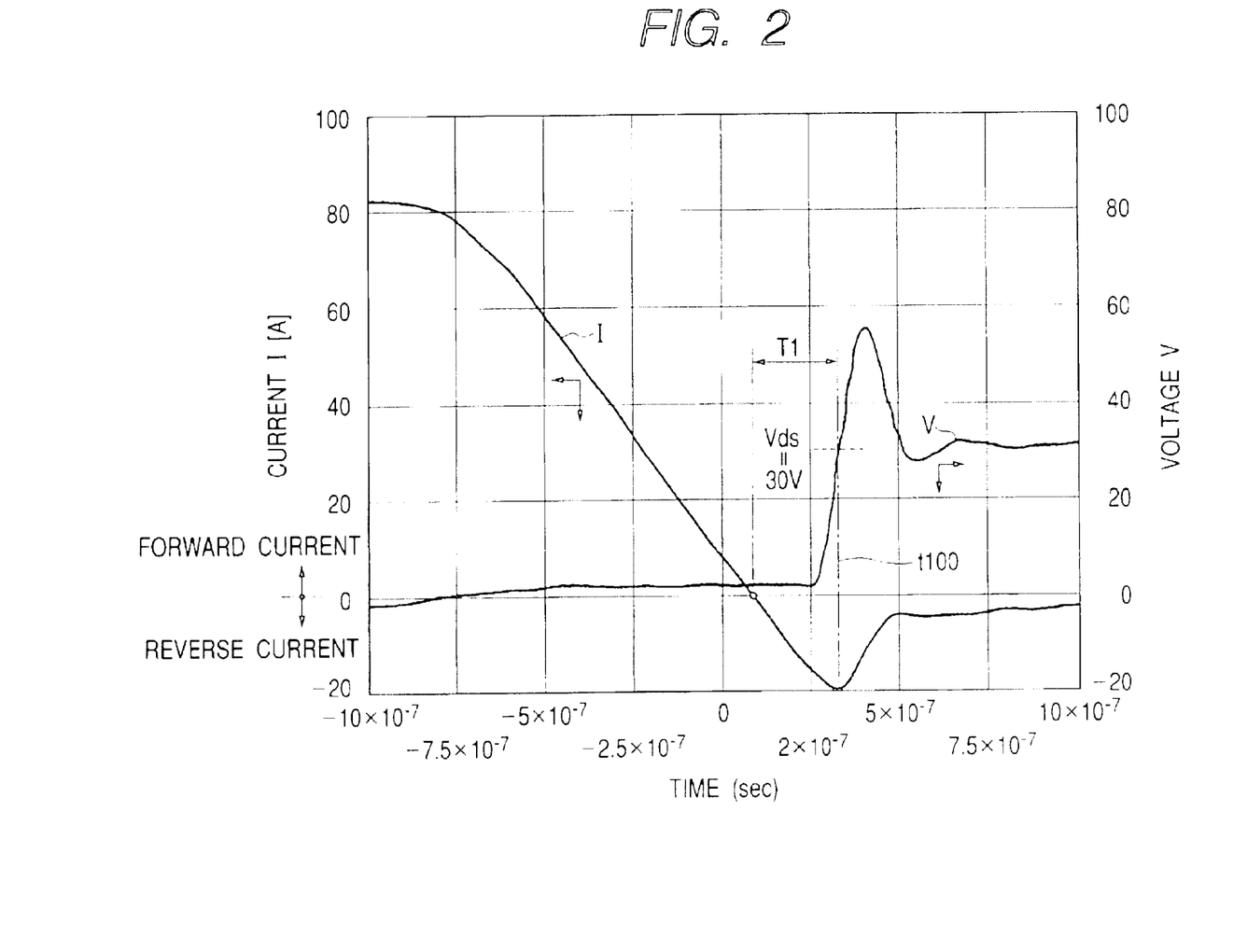
FIG. 2 is a graph showing measurement result of recovery characteristics of a DMOS element in accordance with the preferred embodiment of the present invention.

FIG. 2 shows measurement result of recovery characteristics (i.e., reverse recovery characteristics) of the DMOS element in accordance with the above-described embodiment of the present invention. The recovery characteristics (i.e., reverse recovery characteristics) is a current-voltage relationship obtained in a moment the p-n junction between the n drift layer and the p base region is turned from a forward direction (conductive condition) to a reverse direction (non-conductive condition).

In FIG. 2, an abscissa represents time, a left ordinate represents current, and a right ordinate represents voltage. At the time t100, the reverse recovery current is maximized (dI/dt=0) while the voltage becomes equal to the power source voltage Vds (=30V).

Figure 3:
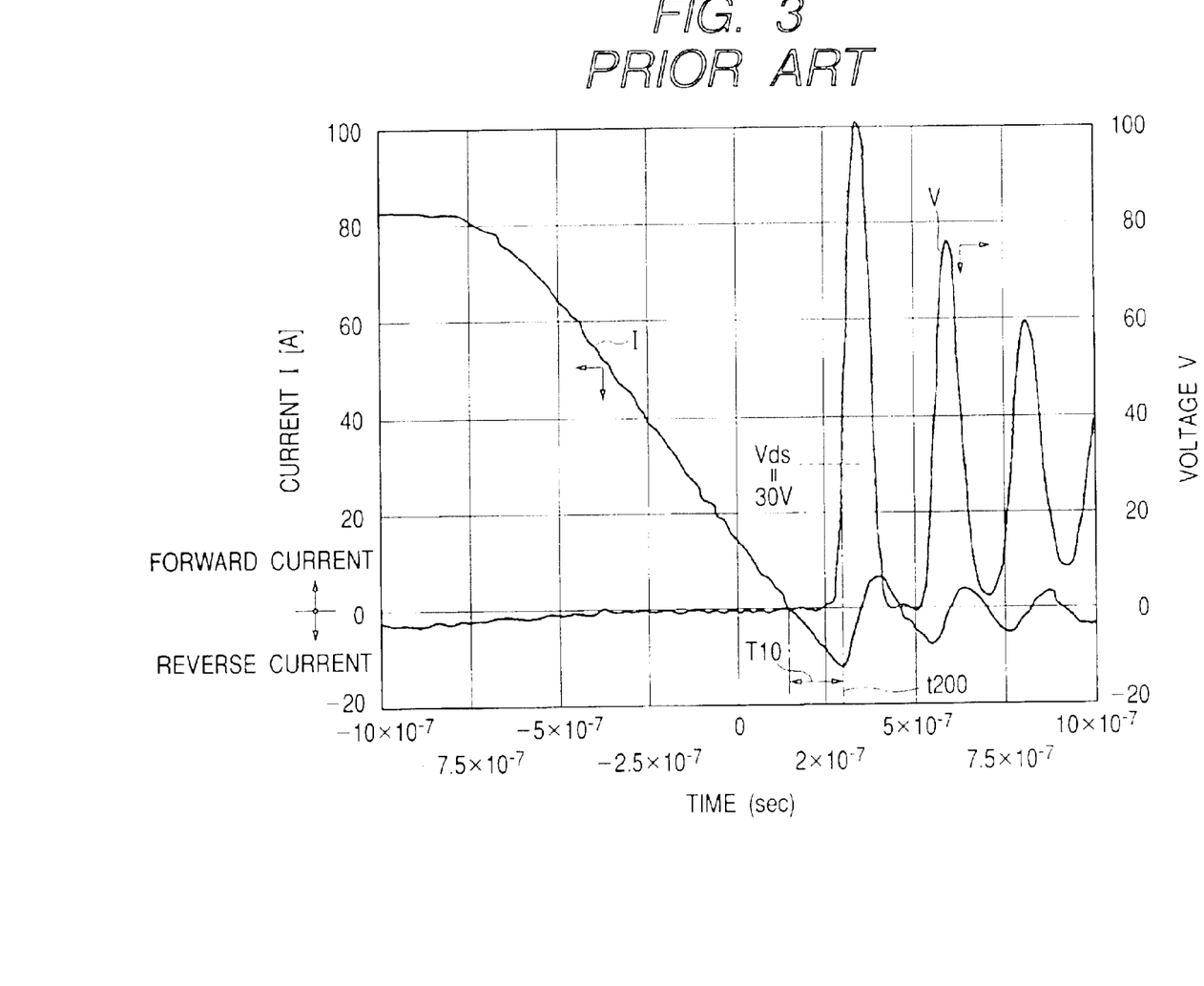
FIG. 3 is a graph showing measurement result of recovery characteristics of a conventional DMOS element.

FIG. 3 shows measurement result of recovery characteristics (i.e., reverse recovery characteristics) of the conventional DMOS element shown in FIG. 12. At the time t200, the reverse recovery current is maximized (dI/dt=0) while the voltage becomes equal to the power source voltage Vds (=30V). The time T10 required for the current to reach the maximum reverse point (dI/dt=0, V=Vds) from a zero-crossing point is relatively short. However, both the current and the voltage fluctuate largely after the time t200. This possibly induces the recovery surge voltage and the oscillation.

On the contrary, according to the DMOS element of the preferred embodiment of the present invention shown in FIG. 1, the N cluster containing layer 3 is positioned at the depth of approximately 2 μm from the bottom surface of p base region 5. The bottom surface of p base region 5 corresponds to a p-n junction constituting a body diode. A depletion layer, surrounding the p base region 5 from the bottom, extends laterally beyond the edge of p base region 5. The N cluster containing layer 3 extends fully within the region of the depletion layer in parallel with the surface of the semiconductor substrate. The extension of the depletion layer is approximately 10 μm with respect to the p-n junction. Namely, the depletion layer protrudes outward from the edge of p base region 5 by an amount of approximately 10 μm. The N cluster containing layer 3 has a very short lifetime.

Accordingly, when the body diode is in a reverse recovery process during operation of an inverter, holes (i.e., carriers) residing in the n-epitaxial layers (i.e., drift layer) 2, 4 quickly extinguish in the vicinity of the p base region 5. Hence, the time T1 required for the current to reach the maximum reverse point (dI/dt=0, V=Vds) from a zero-crossing point is sufficiently short. In other words, the DMOS element of the present invention brings speedily recovery and hence realizes fast recovery characteristics.

Figure 4:
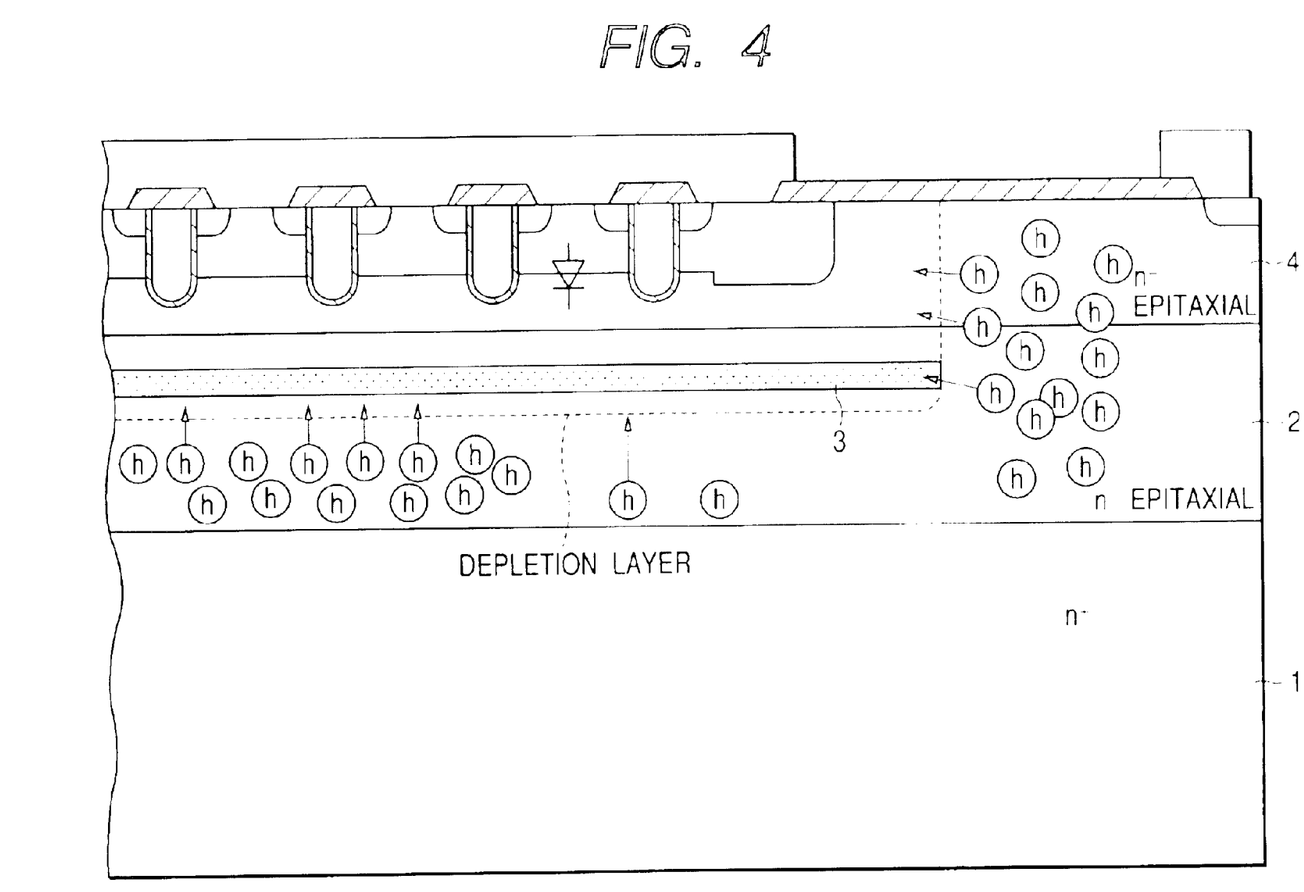
FIG. 4 is a vertical cross-sectional view explaining the operation of the n channel vertical MOSFET in accordance with the preferred embodiment of the present invention.

FIG. 4 shows the distribution of carriers at time t100 shown in FIG. 2. As shown in FIG. 4, the holes in the n-epitaxial layer 2 reside under the N cluster containing layer 3 in a concentrated manner. Furthermore, non-extinguished holes are stored in the region where no N cluster-forming layer 3 is provided. These holes function as current source. Hence, the reverse recovery current gradually approaches to 0 ampere after the time t100 shown in FIG. 2. This suppresses the generation of surge voltage during the recovery of a diode, thereby realizing soft recovery characteristics.

As described above, according to the conventional DMOS element shown in FIG. 12, no holes are stored under or outside the depletion layer at the time t200 shown in FIG. 3. Accordingly, the current causes oscillation after the time t200 and converges to 0 after elapse of a significant time.

On the other hand, according to the DMOS element of the present invention shown in FIG. 1, a sufficient amount of holes (carriers) are stored under and outside the depletion layer at the time t100 shown in FIG. 2. Accordingly, the current smoothly recovers to 0 after time t100 without causing oscillation.

As described above, the preferred embodiment of the present invention provides a DMOS element having a rated withstand voltage of 60~200V which is characterized in that the N cluster containing layer 3 is locally formed at the depth of approximately 1~3 μm from the bottom surface of p base region 5 as shown in FIG. 1. The N cluster containing layer 3 is a region where the lifetime of holes is short. Locally forming the N cluster containing layer 3 makes it possible to leave the carriers in the drift layer and accordingly improves the recovery characteristics of the body diode in the DMOS element. In this case, the N cluster containing layer 3 is selectively disposed along the plane parallel to the surface of the semiconductor substrate. This substantially provides the drift layer outside the N cluster containing layer 3 in addition to the drift layer located under the N cluster containing layer 3. The added drift layer acts to suppress the surge voltage and oscillation.

Next, a manufacturing method of the above-described DMOS element of the present invention will be explained with reference to FIGS. 5 to 10.

Figure 5:
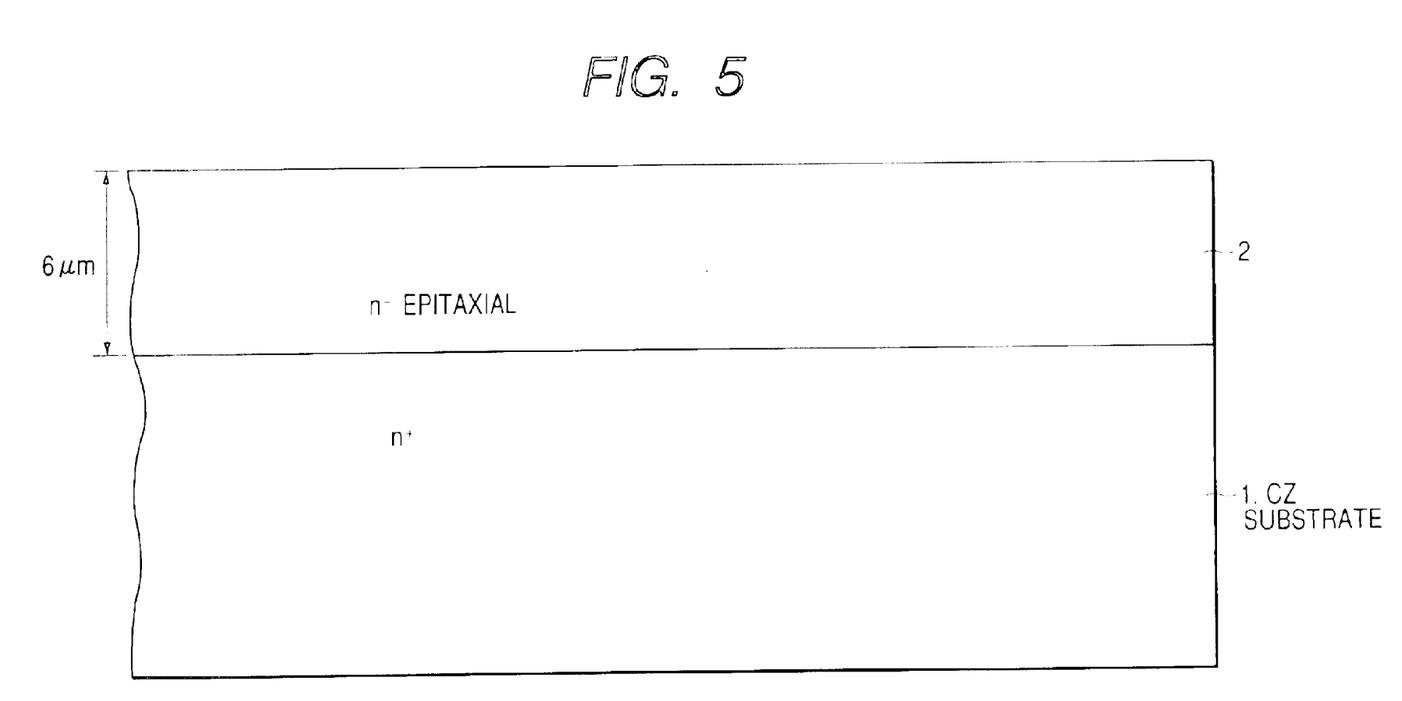
FIG. 5 is a vertical cross-sectional view explaining a manufacturing step of the n channel vertical MOSFET in accordance with the preferred embodiment of the present invention.

First, as shown in FIG. 5, the n-epitaxial layer 2 having a thickness of 6 μm is formed on an arsenic-doped CZ substrate 1. In other words, a semiconductor layer (2, 4) is formed on the surface of the semiconductor substrate (1) by using epitaxial growth. The n-epitaxial layer 2 contains phosphorus doped by the concentration of $3 \times 10^{15}$ cm$^{-3}$.

Figure 6:
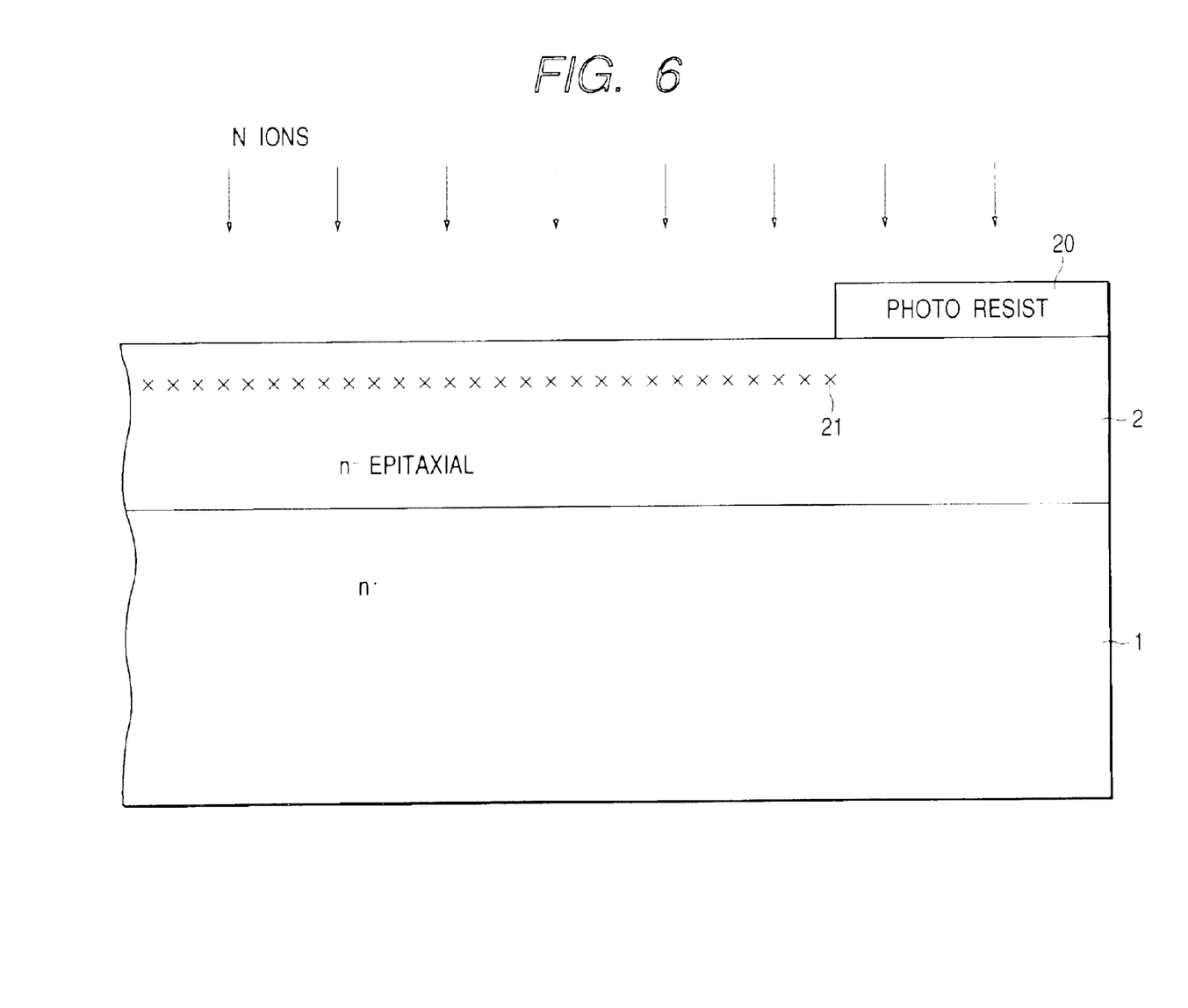
FIG. 6 is a vertical cross-sectional view explaining another manufacturing step of the n channel vertical MOSFET in accordance with the preferred embodiment of the present invention.
Figure 7:
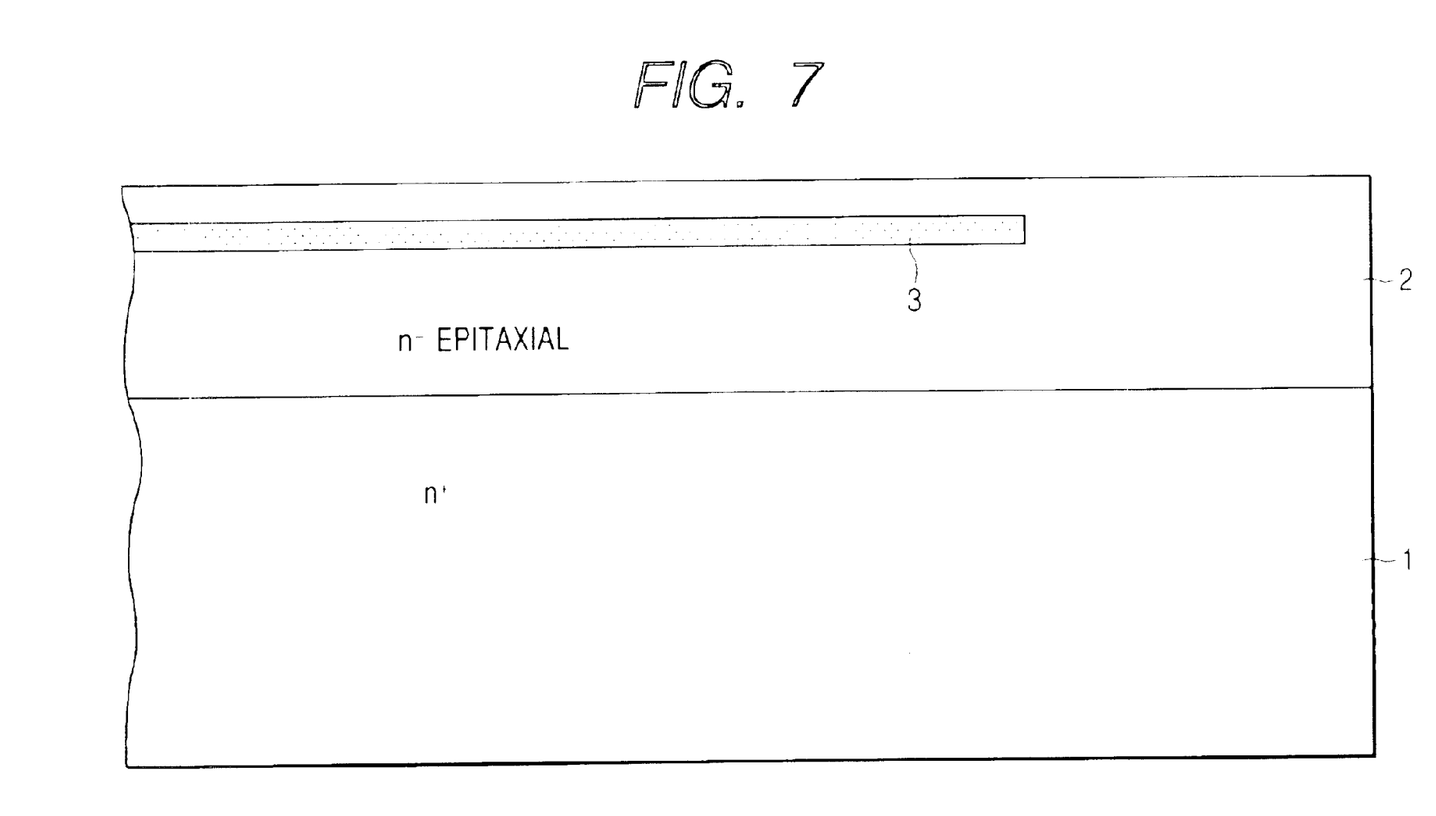
FIG. 7 is a vertical cross-sectional view explaining another manufacturing step of the n channel vertical MOSFET in accordance with the preferred embodiment of the present invention.

Next, as shown in FIG. 6, a photo resist 20 is formed or placed on the upper surface of a wafer shown in FIG. 5. The surface covered by the photo resist 20 corresponds to the chip peripheral region. Then, N (nitrogen) ions are irradiated from above and implanted into the wafer by a dose of $1H10^{15} \sim 1H10^{16}$ (cm$^{-2}$). Through the irradiation of N ions (i.e., nitrogen ion implantation), a crystal defective layer 21 is formed at a predetermined depth in the n-epitaxial layer 2. Then, the wafer is subjected to a thermal treatment at 1,170° C. for one hour to form the N cluster containing layer 3 in the n-epitaxial layer 2 as shown in FIG. 7. More specifically, the N cluster containing layer 3 is selectively embedded in the n-epitaxial layer 2 along a plane parallel to the wafer surface so as to leave at least part of n-epitaxial layer 2 under the N cluster containing layer 3.

Figure 8:
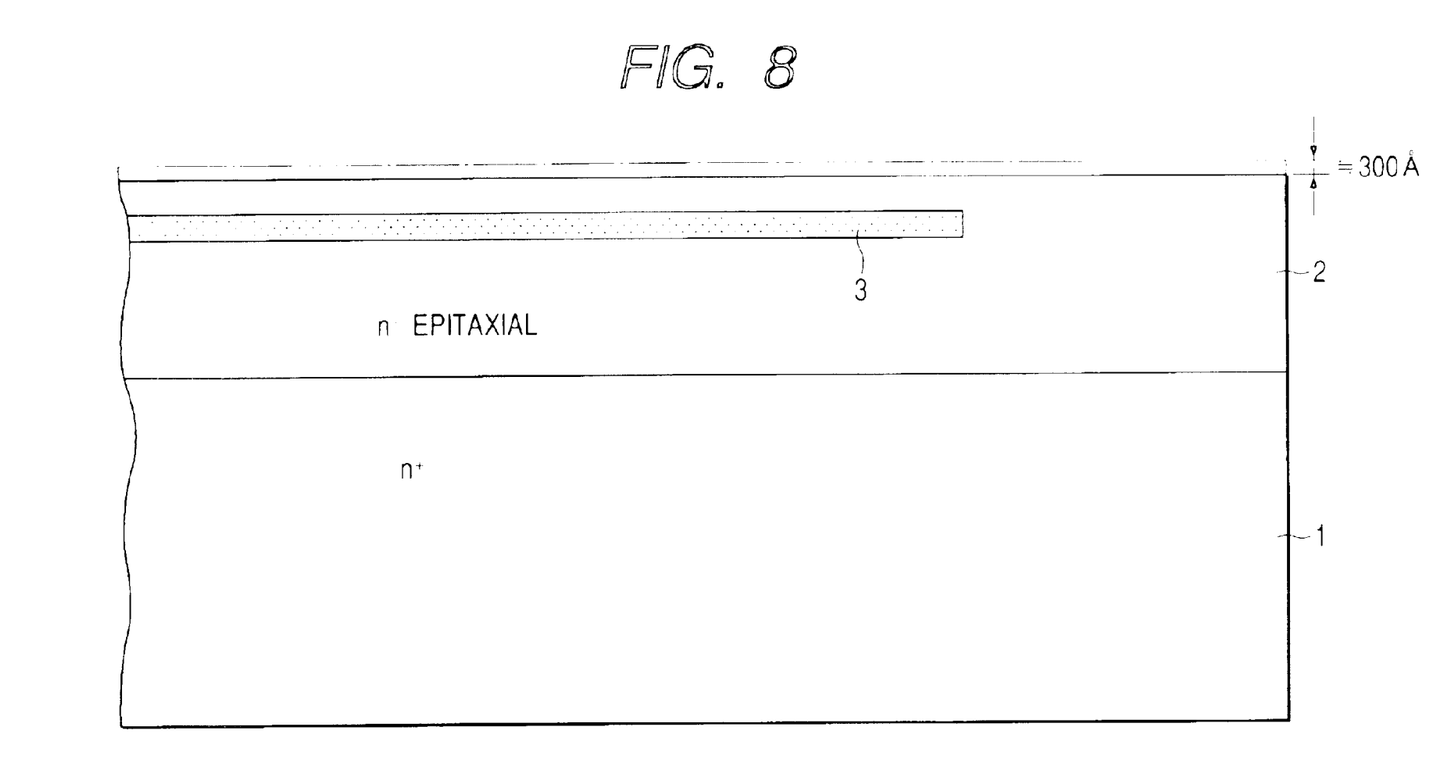
FIG. 8 is a vertical cross-sectional view explaining another manufacturing step of the n channel vertical MOSFET in accordance with the preferred embodiment of the present invention.

After finishing the ion implantation and thermal treatment process for forming the N cluster containing layer 3, defective portions containing the segregation of nitrogen are discretely left on the surficial region of the substrate (within the thickness of 300 angstroms). The presence of these defective portions possibly induces the defective of an epitaxial layer formed in the next process. Hence, as shown in FIG. 8, the surficial region of the n-epitaxial layer 2 is completely removed by the thickness of 300 angstroms. In other words, the removal of the outermost surficial region of the n-epitaxial layer 2 surely leaves a fresh surface of n-epitaxial layer 2 which is free from the crystal defect.

Figure 9:
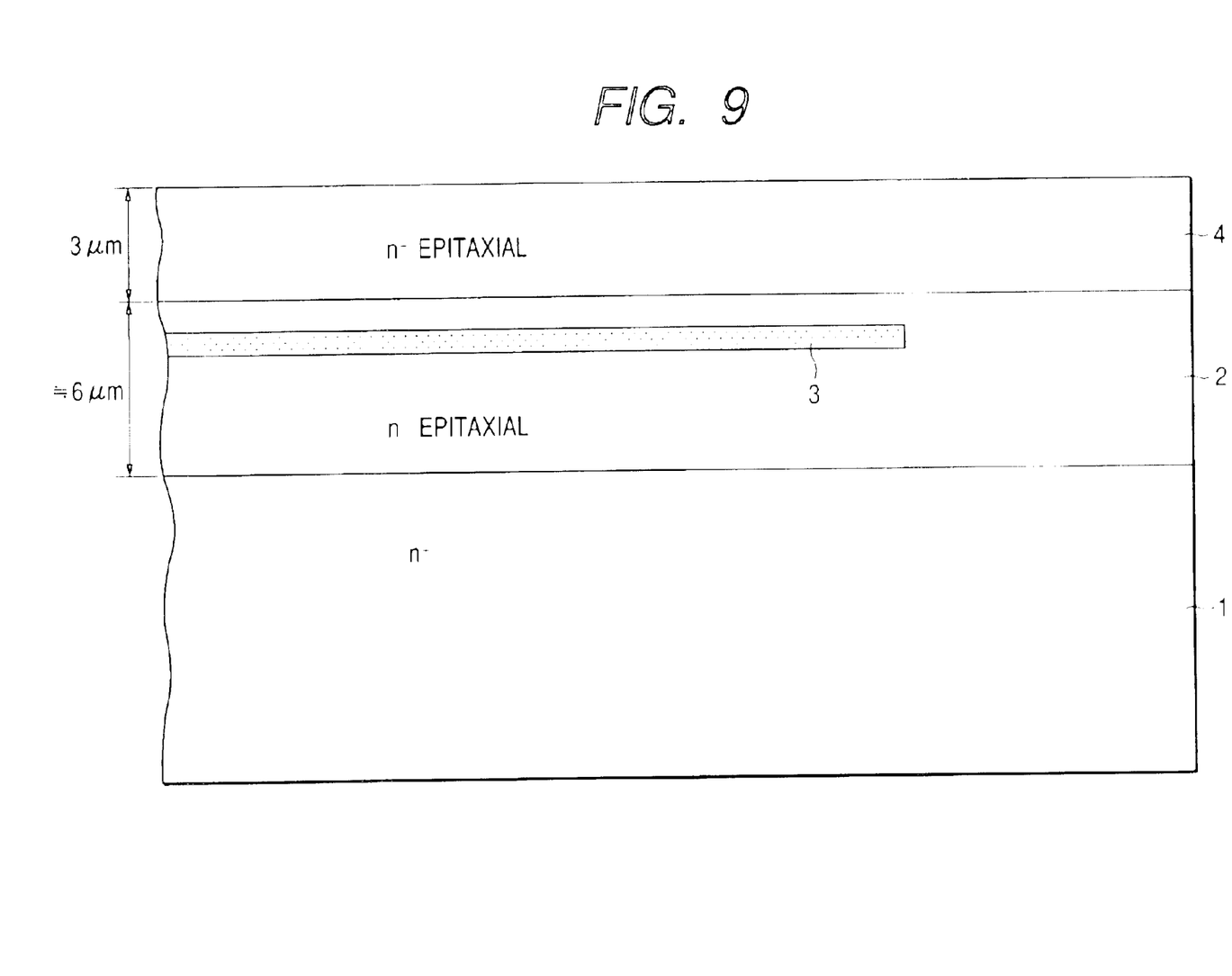
FIG. 9 is a vertical cross-sectional view explaining another manufacturing step of the n channel vertical MOSFET in accordance with the preferred embodiment of the present invention.

Next, as shown in FIG. 9, the n-epitaxial layer 4 having the thickness of 3 μm is formed on the fresh surface of n-epitaxial layer 2. The n-epitaxial layer 4 thus obtained is an excellent semiconductor layer having less crystal defect.

The formation of N cluster containing layer 3 provides a local region having a very short hole lifetime (approximately 0.1 μsec) at a predetermined depth from the wafer surface. The remaining region of the substrate has the lifetime (approximately 200 μsec) of an ordinary epitaxial layer.

Figure 10:
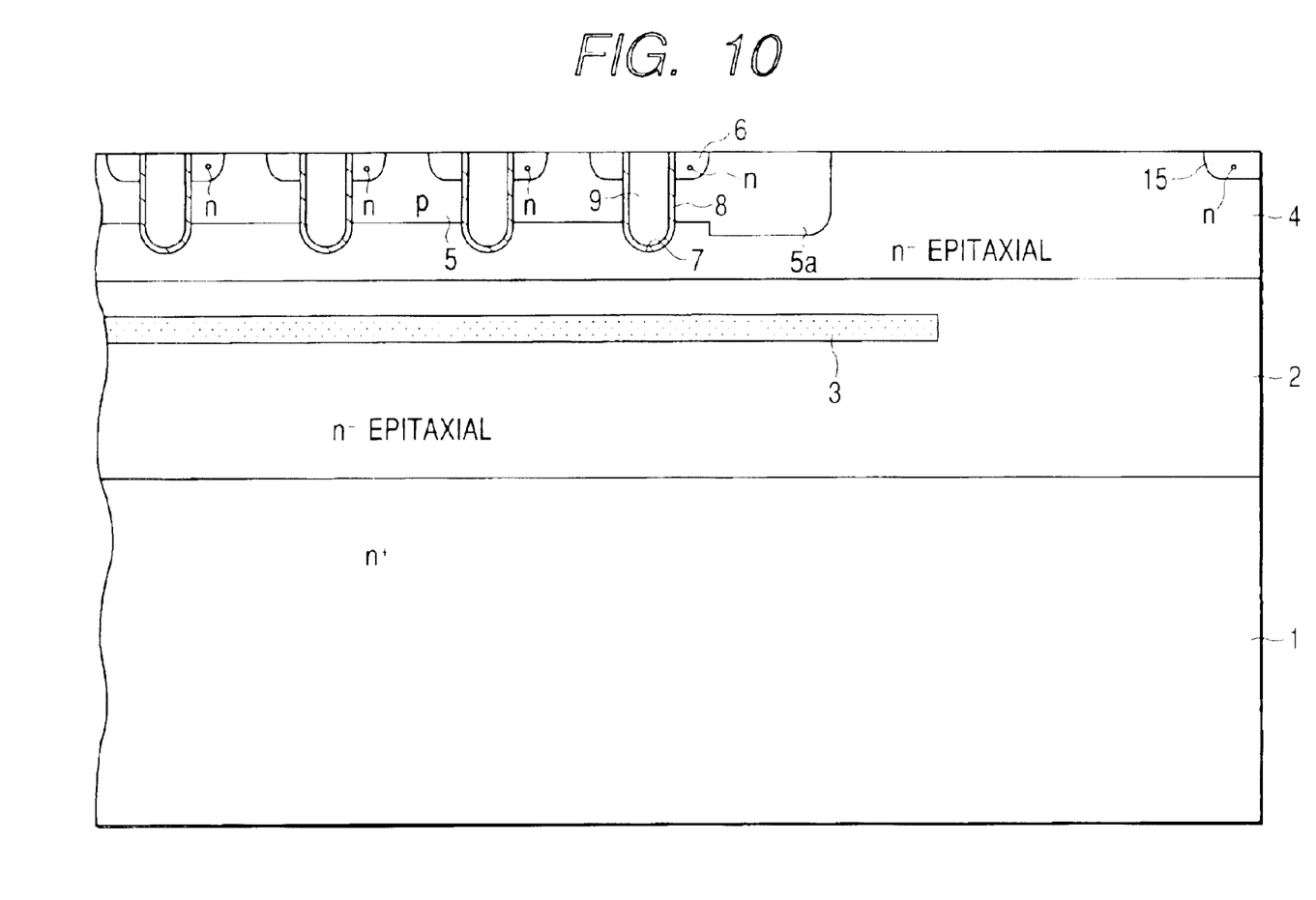
FIG. 10 is a vertical cross-sectional view explaining another manufacturing step of the n channel vertical MOSFET in accordance with the preferred embodiment of the present invention.

Next, the thus formed wafer is finished into a trench type DMOS element by using an ordinary semiconductor manufacturing technique. More specifically, as shown in FIG. 10, p base region 5 (5a), n source regions 6 and n region 15 are formed on the n-epitaxial layer 4. Thereafter, trenches 7 are formed. The gate oxide film 8 is formed in each trench 7. Next, as shown in FIG. 1, insulating films 10 and 13 and source electrode 11, equipotential ring 14, and drain electrode 12 are formed to obtain the DMOS element.

Although FIG. 1 shows the n channel vertical MOSFET, the type of semiconductor substrate 1 is not limited to the specific one and is therefore determined to be either n type or p type depending on the device structure. From the similar reason, the type of epitaxial layers 2 and 4 can be determined to be either n type or p type. Furthermore, according to the arrangement shown in FIG. 1, the N cluster containing layer 3 is not provided in the chip peripheral region. However, it is possible to provide the N cluster containing layer 3 arbitrarily in the chip peripheral region.

This invention may be embodied in several forms without departing from the spirit of essential characteristics thereof. The present embodiment as described is therefore intended to be only illustrative and not restrictive, since the scope of the invention is defined by the appended claims rather than by the description preceding them. All changes that fall within the metes and bounds of the claims, or equivalents of such metes and bounds, are therefore intended to be embraced by the claims.

What is claimed is:

1. A metal oxide semiconductor transistor comprising:
   a drift layer of a first conductive type formed on a substrate, wherein the drift layer has a first epitaxial layer of a first conductive type and having a first thickness and a second epitaxial layer of a first conductive type and having a second thickness, the first thickness being greater than the second thickness;
   a base region of a second conductive type formed on said second epitaxial layer of said drift layer;
   at least one source region of the first conductive type formed in a surficial layer of said base region;
   at least one gate electrode facing to said base region and said source region via a gate insulating film;
   a source electrode in contact with said base region and said source region; and
   a nitrogen cluster containing layer embedded in said first epitaxial layer of said drift layer and extending under said base region so that at least a part of said first epitaxial layer of said drift layer under said nitrogen cluster containing layer is larger that a part of said first epitaxial layer of said drift layer over said nitrogen cluster containing layer.

2. The metal oxide semiconductor transistor in accordance with claim 1, wherein the center of said nitrogen cluster containing layer is positioned at the depth of 1 μm to 3 μm from a bottom surface of said base region.

3. The metal oxide semiconductor transistor in accordance with claim 1, wherein a depletion layer extends laterally beyond the edge of said base region, and said nitrogen cluster containing layer extends fully within the region of said depletion layer in parallel with the surface of said semiconductor substrate.

4. The metal oxide semiconductor transistor in accordance with claim 1, wherein the first epitaxital layer has a thickness of about 3 μm.

5. The metal oxide semiconductor transistor in accordance with claim 1, wherein the second epitaxial layer has a thickness of about 3 μm.

6. The metal oxide semiconductor transistor in accordance with claim 1, wherein a distance from an edge of the base region to an edge of the nitrogen cluster containing layer is about 10 μm.

7. The metal oxide semiconductor transistor in accordance with claim 1, wherein the center of said nitrogen cluster containing layer is positioned at the depth of 1 μm to 4.7 μm from a top surface of said base region.

8. The metal oxide semiconductor transistor in accordance with claim 1, wherein said nitrogen cluster containing layer is selectively disposed along a plane parallel to a surface of said semiconductor substrate.

9. The metal oxide semiconductor transistor in accordance with claim 8, wherein said nitrogen cluster containing layer is not provided in a peripheral region of said semiconductor substrate.

* * * * *